(12) United States Patent
Luo

(10) Patent No.: US 11,877,475 B2
(45) Date of Patent: Jan. 16, 2024

(54) DISPLAY PANEL INCLUDING STORAGE CAPACITOR AND METHOD FOR MANUFACTURING SAME

(71) Applicant: Shenzhen China Star Optoelectronics Semiconductor Display Technology Co., Ltd., Guangdong (CN)

(72) Inventor: Chuanbao Luo, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 795 days.

(21) Appl. No.: 16/963,832

(22) PCT Filed: May 20, 2020

(86) PCT No.: PCT/CN2020/091268
§ 371 (c)(1),
(2) Date: Jul. 22, 2020

(87) PCT Pub. No.: WO2021/227106
PCT Pub. Date: Nov. 18, 2021

(65) Prior Publication Data
US 2023/0088235 A1 Mar. 23, 2023

(30) Foreign Application Priority Data
May 14, 2020 (CN) .......................... 202010407451.2

(51) Int. Cl.
*H10K 59/121* (2023.01)
*H10K 59/131* (2023.01)
(Continued)

(52) U.S. Cl.
CPC ....... *H10K 59/1213* (2023.02); *H01L 27/124* (2013.01); *H01L 27/1225* (2013.01);
(Continued)

(58) Field of Classification Search
CPC .......... H10K 59/1213; H10K 59/1216; H10K 59/122; H10K 59/131; H10K 59/38
See application file for complete search history.

(56) References Cited

U.S. PATENT DOCUMENTS

2007/0098879 A1* 5/2007 Makiura ................ H10K 50/17
257/E21.271
2011/0127514 A1* 6/2011 Matsumuro ............ H05B 33/10
438/22
(Continued)

FOREIGN PATENT DOCUMENTS

CN 101051626 10/2007
CN 103208506 7/2013
(Continued)

*Primary Examiner* — Nduka E Ojeh

(57) ABSTRACT

A display panel and a method for manufacturing the same are provided. The display panel comprises a thin film transistor array substrate, a storage capacitor, and a light-emitting element, wherein the thin film transistor array substrate comprises a driving thin film transistor and a switching thin film transistor, the driving thin film transistor and the switching thin film transistor are electrically connected, the driving thin film transistor and the light-emitting element are electrically connected, and the storage capacitor comprises a conductive portion of a first active layer of the switching thin film transistor and an anode of the light-emitting element.

17 Claims, 3 Drawing Sheets

(51) Int. Cl.
- *H10K 59/122* (2023.01)
- *H10K 71/00* (2023.01)
- *H10K 59/38* (2023.01)
- *H10K 50/86* (2023.01)
- *H01L 27/12* (2006.01)
- *H10K 59/12* (2023.01)

(52) U.S. Cl.
CPC ......... *H10K 50/865* (2023.02); *H10K 59/122* (2023.02); *H10K 59/1216* (2023.02); *H10K 59/131* (2023.02); *H10K 59/38* (2023.02); *H10K 71/00* (2023.02); *H10K 59/1201* (2023.02)

(56) References Cited

U.S. PATENT DOCUMENTS

| | | |
|---|---|---|
| 2014/0054592 A1 | 2/2014 | Gu et al. |
| 2018/0033849 A1* | 2/2018 | Noh ..................... H01L 27/124 |
| 2019/0074304 A1 | 3/2019 | Lee et al. |
| 2019/0189974 A1 | 6/2019 | Gunji |
| 2019/0229172 A1* | 7/2019 | Liu .................... H01L 29/78693 |
| 2020/0005708 A1* | 1/2020 | Hwang ................. H10K 59/131 |
| 2021/0043707 A1* | 2/2021 | Park ..................... H10K 59/1213 |
| 2021/0233984 A1* | 7/2021 | Wang ..................... H10K 59/13 |
| 2021/0408160 A1* | 12/2021 | Yuan ................. H10K 59/1213 |

FOREIGN PATENT DOCUMENTS

| | | |
|---|---|---|
| CN | 103296030 | 9/2013 |
| CN | 104134426 | 11/2014 |
| CN | 104681585 | 6/2015 |
| CN | 109256396 | 1/2019 |
| CN | 109920923 | 6/2019 |
| CN | 110164373 | 8/2019 |
| CN | 110634890 | 12/2019 |
| WO | WO 2019/185011 | 10/2019 |

* cited by examiner

DISPLAY PANEL INCLUDING STORAGE CAPACITOR AND METHOD FOR MANUFACTURING SAME

RELATED APPLICATIONS

This application is a National Phase of PCT Patent Application No. PCT/CN2020/091268 having International filing date of May 20, 2020, which claims the benefit of priority of Chinese Patent Application No. 202010407451.2 filed on May 14, 2020. The contents of the above applications are all incorporated by reference as if fully set forth herein in their entirety.

FIELD AND BACKGROUND OF THE INVENTION

The present disclosure relates to the field of display technology, and in particular, to a display panel and a method for manufacturing the same.

Organic light emitting diode (OLED) display panels have advantages of high brightness, wide viewing angles, fast response speeds, and low power consumption. In the OLED display panel, the OLED main driving architecture is a 2-transistor-1-capacitor (2T1C) main driver architecture which consists of switching/driving thin film transistors (TFT) and a storage capacitor Cst. Currently, an area of the storage capacitor of the display panel is about 8-10 times an area of the TFT, which reduces an aperture ratio of the display panel.

Therefore, it is necessary to propose a new technical solution to solve the above technical problem.

SUMMARY OF THE INVENTION

Embodiments of the present disclosure provide a display panel and a method for manufacturing the same, which can improve the aperture ratio of the display panel.

In a display panel provided in an embodiment of the present disclosure, the display panel comprises a thin film transistor array substrate, a storage capacitor, and a light-emitting element, wherein the thin film transistor array substrate comprises a driving thin film transistor and a switching thin film transistor, the driving thin film transistor and the switching thin film transistor are electrically connected, the driving thin film transistor and the light-emitting element are electrically connected, and the storage capacitor comprises a conductive portion of a first active layer of the switching thin film transistor and an anode of the light-emitting element.

In a display panel provided in an embodiment of the present disclosure, the switching thin film transistor comprises the first active layer, a first gate electrode, a first source electrode, and a first drain electrode, wherein the first source electrode and the first drain electrode are electrically connected to the first active layer respectively, and the driving thin film transistor comprises a second active layer, a second gate electrode, a second source electrode, and a second drain electrode, wherein the second source electrode and the second drain electrode are electrically connected to the second active layer respectively, and the second gate electrode is electrically connected to the first drain electrode.

In a display panel provided in an embodiment of the present disclosure, the thin film transistor array substrate further comprises a substrate, a first buffer layer, wherein the second active layer covers a portion of the first buffer layer, a first gate insulation layer, wherein the first gate insulation layer covers the second active layer and the first buffer layer, a light-shielding layer, wherein the light-shielding layer and the second gate electrode are arranged on a same layer, a second buffer layer, wherein the second buffer layer covers the light-shielding layer, the second gate electrode, and the first gate insulation layer, and the first active layer is arranged on the second buffer layer, a second gate insulation layer, wherein the second gate insulation layer covers a portion of the first active layer, and the first gate electrode is arranged on the second gate insulation layer, an interlayer dielectric layer, wherein the interlayer dielectric layer covers the second buffer layer, the first active layer, and the first gate electrode, a metal layer, wherein the metal layer comprises a first connecting line, a first through hole, a second through hole, and a third through hole, the first connecting line is arranged on the interlayer dielectric layer, a first end of the first connecting line is electrically connected to the first drain electrode via the first through hole, the second through hole passes through the interlayer dielectric layer, a second end of the first connecting line is electrically connected to the second gate electrode via the second through hole, and the second drain electrode is electrically connected to the anode via the third through hole, and a passivation layer, wherein the passivation layer covers the interlayer dielectric layer.

In a display panel provided in an embodiment of the present disclosure, the storage capacitor comprises the conductive portion of the first active layer of the switching thin film transistor as a lower plate and the anode opposite to the lower plate as an upper plate.

In a display panel provided in an embodiment of the present disclosure, the lower plate and the upper plate are transparent.

In a display panel provided in an embodiment of the present disclosure, a thickness of the lower plate ranges from 10 nm to 100 nm, and a thickness of the upper plate ranges from 40 nm to 180 nm.

In a display panel provided in an embodiment of the present disclosure, the storage capacitor further comprises a dielectric layer, wherein the dielectric layer comprises one or any combination of the interlayer dielectric layer, the passivation layer, a color filter layer of the light-emitting element, and a pixel definition layer of the light-emitting element which are arranged between the lower plate and the upper plate.

In a display panel provided in an embodiment of the present disclosure, a material of the dielectric layer comprises one or a combination of silicon nitride and aluminum oxide.

In a display panel provided in an embodiment of the present disclosure, the display panel further comprises a compensation thin film transistor, wherein the compensation thin film transistor comprises a third active layer, a third gate electrode, a third source electrode, and a third drain electrode, the third source electrode and the third drain electrode are electrically connected to the third active layer respectively, and the third active layer and the first active layer are arranged on a same layer.

In a display panel provided in an embodiment of the present disclosure, the switching thin film transistor and the compensation thin film transistor comprise metal oxide thin film transistors, and the driving thin film transistor comprises a low-temperature polysilicon thin film transistor.

In a display panel provided in an embodiment of the present disclosure, the thin film transistor array substrate further comprises a third gate insulation layer, wherein the third gate insulation layer is arranged on the third active layer, the third gate electrode is arranged on the third gate insulation layer, and the third gate insulation layer is formed when the second gate insulation layer is formed.

In a display panel provided in an embodiment of the present disclosure, the metal layer further comprises a second connecting line and a fourth through hole, wherein a first end of the second connecting line is electrically connected to the second drain electrode via the third through hole, and a second end of the second connecting line is electrically connected to the third source electrode via the fourth through hole.

A method for manufacturing a display panel provided in an embodiment of the present disclosure comprises forming a thin film transistor array substrate, wherein the thin film transistor array substrate comprises a driving thin film transistor and a switching thin film transistor, the switching thin film transistor comprises a first active layer, a first gate electrode, a first source electrode, and a first drain electrode, and the driving thin film transistor comprises a second active layer, a second gate electrode, a second source electrode, and a second drain electrode, performing a conductor-conversion treatment to at least a portion of the first active layer to form a lower plate of a storage capacitor, and forming a light-emitting element on the thin film transistor array substrate, wherein the light-emitting element comprises a color filter layer, an anode, a light-emitting layer, a cathode, and a pixel definition layer, and a portion of the anode corresponding to the lower plate is used as an upper plate of the storage capacitor.

In a method for manufacturing a display panel provided in an embodiment of the present disclosure, the step of forming the thin film transistor array substrate comprises forming a compensation thin film transistor, wherein the compensation thin film transistor comprises a third active layer, a third gate electrode, a third source electrode, and a third drain electrode, and the third source electrode and the third drain electrode are electrically connected to the third active layer respectively.

In a method for manufacturing a display panel provided in an embodiment of the present disclosure, the third active layer is formed in a process in which the first active layer is formed.

In a method for manufacturing a display panel provided in an embodiment of the present disclosure, the switching thin film transistor comprises a metal oxide thin film transistor, and the driving thin film transistor comprises a low-temperature polysilicon thin film transistor.

In a method for manufacturing a display panel provided in an embodiment of the present disclosure, the lower plate and the upper plate are transparent.

In a method for manufacturing a display panel provided in an embodiment of the present disclosure, a thickness of the lower plate ranges from 10 nm to 100 nm, and a thickness of the upper plate ranges from 40 nm to 180 nm.

In a method for manufacturing a display panel provided in an embodiment of the present disclosure, the storage capacitor further comprises a dielectric layer, wherein the dielectric layer comprises one or any combination of the interlayer dielectric layer, the passivation layer, the color filter layer, and the pixel definition layer which are arranged between the lower plate and the upper plate.

In a method for manufacturing a display panel provided in an embodiment of the present disclosure, a material of the dielectric layer comprises one or a combination of silicon nitride and aluminum oxide.

In the display panel and the method for manufacturing the same provided in the embodiments of the present disclosure, the conductive portion of the first active layer of the switching thin film transistor is used as the lower plate of the storage capacitor, a portion of the anode of the light-emitting element corresponding to the lower plate is used as an upper plate, and the lower plate and the upper plate are arranged to be transparent. Compared with a storage capacitor arranged in a non-light-emitting area in the current technology, the storage capacitor is arranged in a light-emitting area of the display panel through the arrangement, reducing an occupied area of the non-light-emitting area and improving the aperture ratio of the display panel.

Meanwhile, a dielectric material of high dielectric constant is used as the dielectric layer of the storage capacitor, further reducing an area of a capacitor area.

At last, in the display panel and the method for manufacturing the same provided in the embodiments of the present disclosure, the compensation thin film transistor is arranged on the thin film transistor array substrate, effectively compensating a threshold voltage of the driving thin film transistor in each pixel.

DESCRIPTION OF SPECIFIC EMBODIMENTS OF THE INVENTION

To make the purposes, technical solutions, and effects of the present invention more clear and specific, the present invention is described in further detail below with reference to the accompanying drawings. Please refer to the schemas of the accompanying drawings, the identical elements are indicated by a same number. The below descriptions are based on the illustrated specific embodiments of the present disclosure, and shall not be deemed to limit other specific embodiments of the present disclosure not described herein. The term "embodiment" used in the description means an example, instance, or illustration.

In description of the disclosure, it should be understood that orientational or positional relationships represented by directional terms mentioned in the present disclosure, such as central, longitudinal, lateral, length, width, thickness, up, down, front, rear, left, right, vertical, horizontal, top, bottom, inside, outside, clockwise, anticlockwise, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the disclosure, "a plurality of" means two or more than two, unless otherwise specified.

In the description of the present disclosure, it should be understood that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Figure 1:
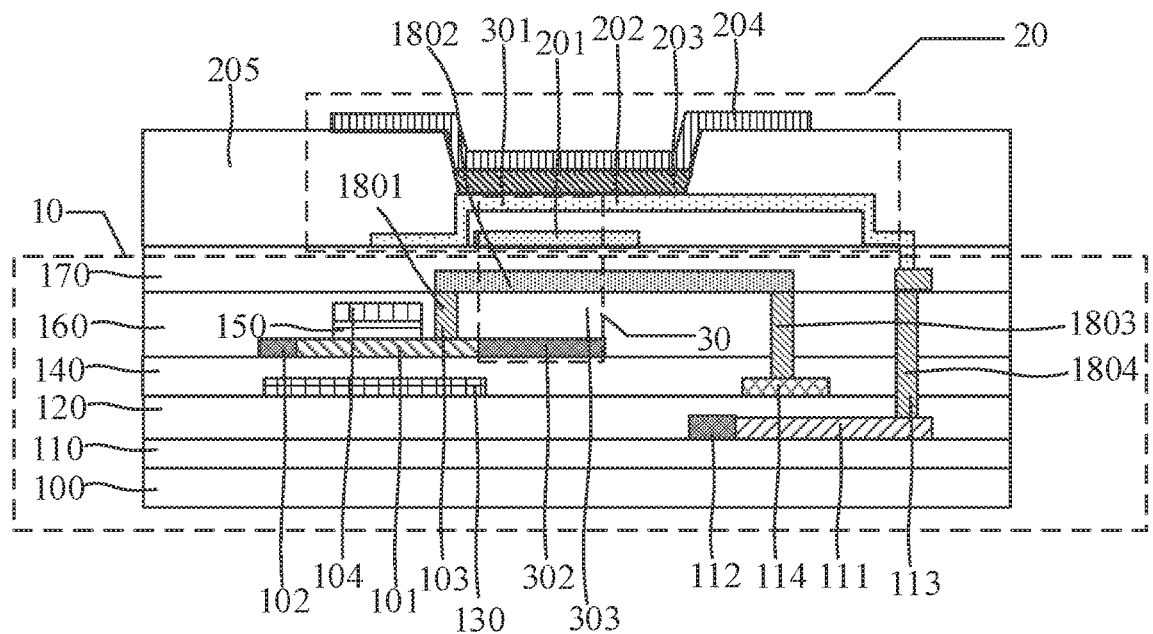
FIG. 1 is a schematic structural diagram illustrating a display panel according to an embodiment of the present disclosure.

Referring to FIG. 1, an embodiment of the present disclosure provides a display panel. The display panel comprises a thin film transistor array substrate 10, a storage capacitor 30, and a light-emitting element 20, wherein the thin film transistor array substrate 10 comprises a driving thin film transistor and a switching thin film transistor, and the driving thin film transistor and the switching thin film transistor are electrically connected. The driving thin film transistor is electrically connected to the light-emitting element 20. The storage capacitor 30 comprises a conductive portion of a first active layer 101 of the switching thin film transistor and an anode 202 of the light-emitting element 20.

In detail, please continue to refer to FIG. 1. The switching thin film transistor comprises the first active layer 101, a first gate electrode 104, a first source electrode 102, and a first drain electrode 103, wherein the first source electrode 102 and the first drain electrode 103 are electrically connected to the first active layer 101. The driving thin film transistor comprises a second active layer 111, a second gate electrode 114, a second source electrode 112, and a second drain electrode 113, wherein the second source electrode 112 and the second drain electrode 113 are electrically connected to the second active layer 111, and the second gate electrode 114 is electrically connected to the first drain electrode 103. The driving thin film transistor comprises a low-temperature-polysilicon thin film transistor, and the switching thin film transistor comprises a metal oxide thin film transistor, for example, the metal oxide thin film transistor is an indium gallium zinc oxide thin film transistor.

Furthermore, the thin-film transistor array substrate 10 further comprises a substrate 100, a first buffer layer 110, a first gate insulation layer 120, a light-shielding layer 130, a second buffer layer 140, a second gate insulation layer 150, an interlayer dielectric layer 160, a metal layer, and a passivation layer 170, wherein the second active layer 111 covers a portion of the first buffer layer 110. The first gate insulation layer 120 covers the second active layer 111 and the first buffer layer 110. The light-shielding layer 130 and the second gate electrode 114 are arranged on a same layer, and the light-shielding layer 130 is formed in a process in which the second gate electrode 114 is formed. The second buffer layer 140 covers the light-shielding layer 130, the second gate electrode 114, and the first gate insulation layer 120, and the first active layer 101 is arranged on the second buffer layer 140. The second gate insulation layer 150 covers a portion of the first active layer 101, and the first gate electrode 104 is arranged on the second gate insulation layer 150. The interlayer dielectric layer 160 covers the second buffer layer 140, the first active layer 101, and the first gate electrode 104. The metal layer comprises a first connecting line 1802, a first through hole 1801, a second through hole 1803, and a third through hole 1804, wherein the first connecting line 1802 is arranged on the interlayer dielectric layer 160, a first end of the first connecting line 1802 is electrically connected to the first drain electrode 103 via the first through hole 1801, the second through hole 1803 passes through the interlayer dielectric layer 160, a second end of the first connecting line 1802 is electrically connected to the second gate electrode 114 via the second through hole 1803, and the second drain electrode 113 is electrically connected to the anode 202 via the third through hole 1804. The passivation layer 170 covers the interlayer dielectric layer 160.

The light-emitting element 20 comprises a color filter layer 201, an anode 202, a light-emitting layer 203, a cathode 204, and a pixel definition layer 205, wherein a material of the anode 202 comprises at least one of indium tin oxide or indium zinc oxide. The storage capacitor 30 comprises the conductive portion of the first active layer 101 as a lower plate 302 and the anode 202 opposite to the lower plate 302 as an upper plate 301. In other words, the lower plate 302 is formed by performing a conductor-conversion treatment to the first active layer 101. Furthermore, the storage capacitor 30 comprises a dielectric layer 303, wherein the dielectric layer 303 comprises one or any combination of the interlayer dielectric layer 160, the passivation layer 170, a color filter layer 201 of the light-emitting element 20, and a pixel definition layer 205 of the light-emitting element 20, which are arranged between the lower plate 301 and the upper plate 302. The lower plate 301 and the upper plate 302 are transparent, wherein a thickness of the lower plate 302 ranges from 10 nm to 100 nm, and a thickness of the upper plate 301 ranges from 40 nm to 180 nm. The dielectric layer 303 comprises a material with a high dielectric constant, such as one or a combination of silicon nitride (SiNx) and aluminum oxide.

Figure 2:
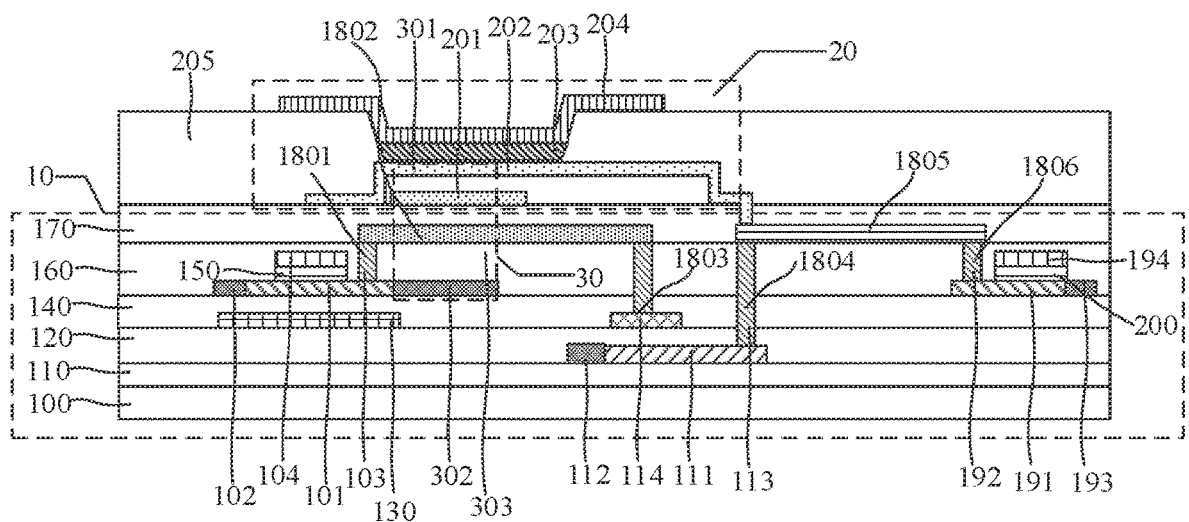
FIG. 2 is a schematic diagram illustrating a display panel with another structure according to an embodiment of the present disclosure.

Optionally, referring to FIG. 2, in the embodiment of the present disclosure, the display panel further comprises a compensation thin film transistor, wherein the compensation thin film transistor comprises a third active layer 191, a third gate electrode 194, a third source electrode 192, and a third drain electrode 193; the third source electrode 192 and the third drain electrode 193 are electrically connected to the third active layer 191 respectively, and the third active layer 191 and the first active layer 101 are arranged on a same layer. Furthermore, the third active layer 191 is formed in a process in which the first active layer 101 is formed. The compensation thin film transistor comprises a metal oxide thin film transistor, for example, the metal oxide thin film transistor is an indium gallium zinc oxide thin film transistor.

Furthermore, continuing to refer to FIG. 2, the thin film transistor array substrate 10 further comprises a third gate insulation layer 200, wherein the third gate insulation layer 200 is arranged on the third active layer 191, the third gate electrode 194 is arranged on the third gate insulation layer 200, and the third gate insulation layer 200 is formed when the second gate insulation layer 150 is formed.

Furthermore, the metal layer further comprises a second connecting line 1805 and a fourth through hole 1806, wherein a first end of the second connecting line 1805 is electrically connected to the second drain electrode 113 via the third through hole 1804, and a second end of the second connecting line 1805 is electrically connected to the third source electrode 192 via the fourth through hole 1806.

Figure 3:
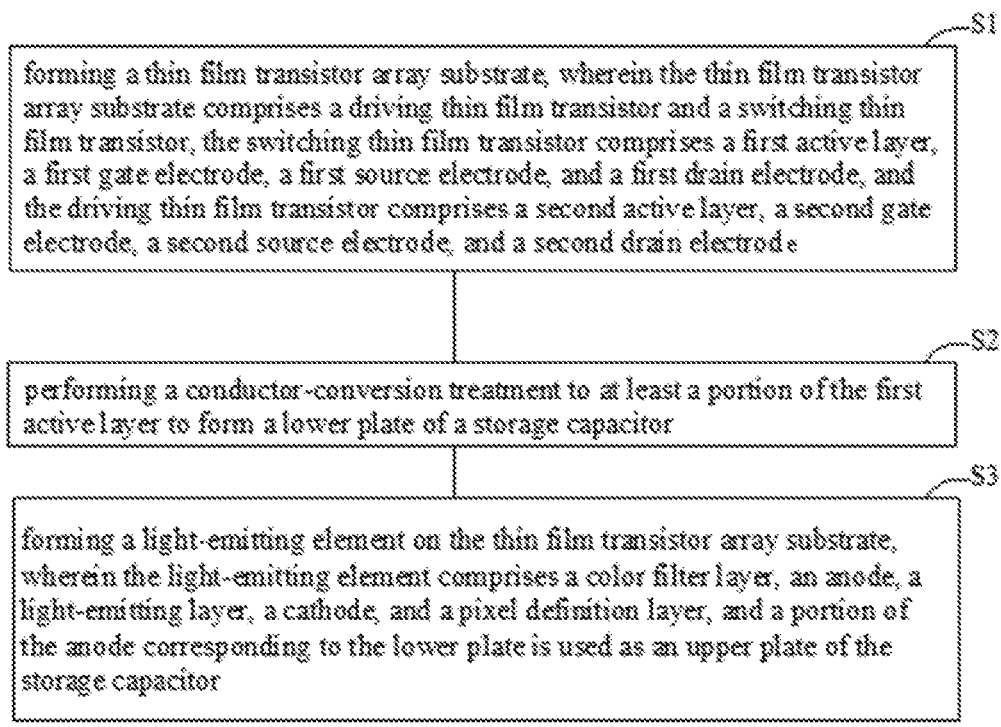
FIG. 3 is a flow diagram illustrating a method for manufacturing a display panel according to an embodiment of the present disclosure.

Referring to a combination of FIG. 1 and FIG. 3, an embodiment of the present disclosure further provides a method for manufacturing a display panel comprising following steps:

step S1: forming a thin film transistor array substrate 10, wherein the thin film transistor array substrate 10 comprises a driving thin film transistor and a switching thin film transistor, the switching thin film transistor comprises a first active layer 101, a first gate electrode 104, a first source electrode 102, and a first drain electrode 103, and the driving thin film transistor comprises a second active layer 111, a second gate electrode 114, a second source electrode 112, and a second drain electrode 113;

step S2: performing a conductor-conversion treatment to at least a portion of the first active layer 101 to form a lower plate 302 of a storage capacitor 30; and step S3: forming a light-emitting element 20 on the thin film transistor array substrate 10, wherein the light-emitting element 20 comprises a color filter layer 201, an anode 202, a light-emitting layer 203, a cathode 204, and a pixel definition layer 205, and a portion of the anode 202 corresponding to the lower plate 302 is used as an upper plate 301 of the storage capacitor 30.

Figure 4:
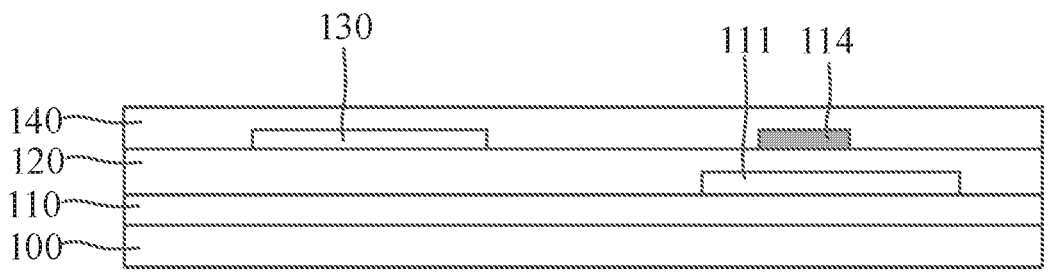
FIGS. 4, 5, 6 and 7 are schematic diagrams illustrating a method for manufacturing a display panel according to an embodiment of the present disclosure.

In detail, in the step S1 and referring to FIG. 4, a layer of at least one of silicon oxide (SiOx) and silicon nitride (SiNx) is deposited on the substrate 100 to form the first buffer layer 110. The second active layer 111 is deposited to be formed on the first buffer layer 110, wherein the second active layer 111 comprises a channel region and a non-channel region, and a source doping area and a drain doping area are formed by performing a nitrogen ion doping process, a phosphorus ion doping process, or a boron ion doping process to the non-channel region. After that, the first gate insulation layer 120 is deposited to be formed on the first buffer layer 110, and the light-shielding layer 130 and the second gate electrode 114 are deposited to be formed on the gate insulation layer 120, wherein the light-shielding layer 130 and the second gate electrode 114 are processed in a same patterning process. At last, the second buffer layer 140 is deposited to be formed on the light-shielding layer 130, the second gate electrode 114, and the gate insulation layer 120 by a chemical vapor depositing method, wherein a material of the second buffer layer 140 comprises at least one of silicon oxide (SiOx) and silicon nitride (SiNx).

Figure 5:
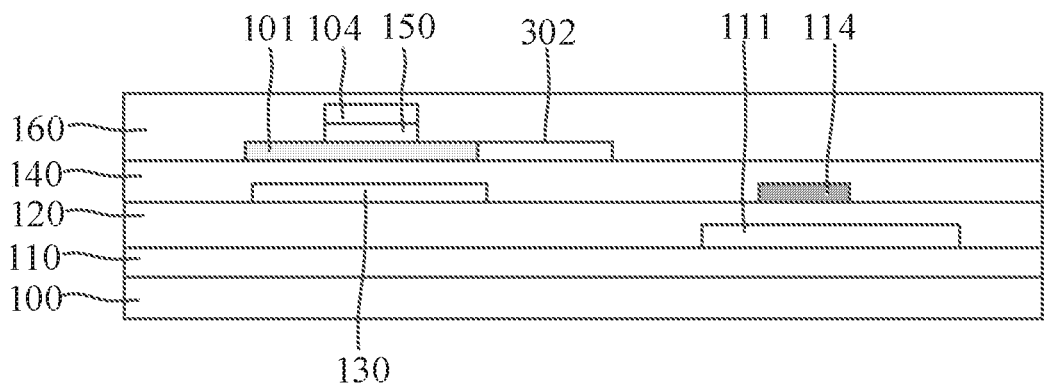
Figure 6:
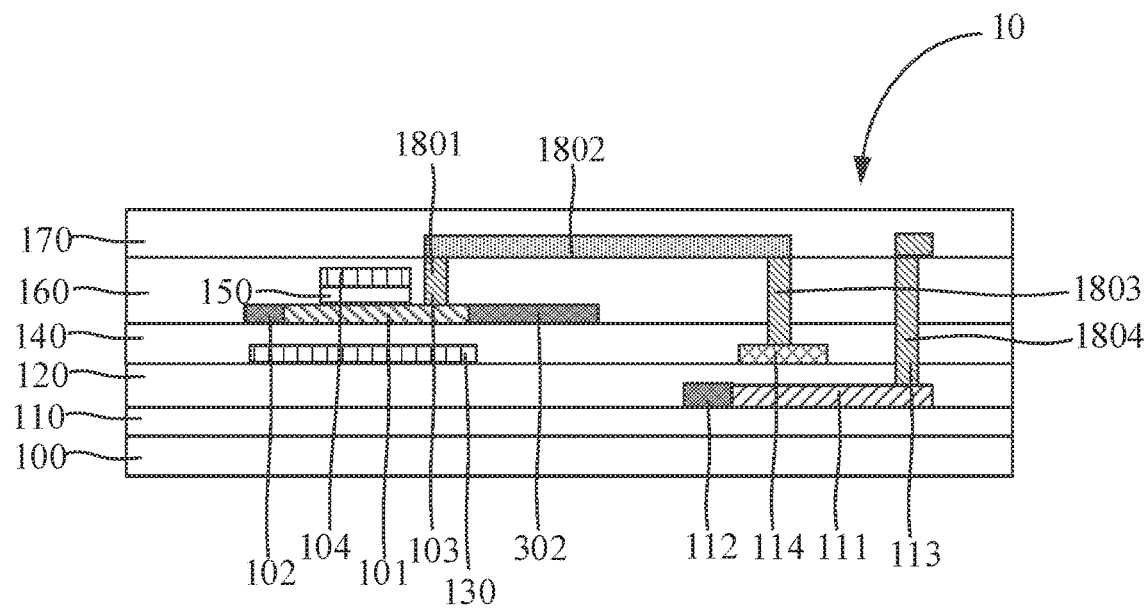

In the step S2 and referring to FIG. 5, the first active layer 101 are deposited to be formed on the second buffer layer 140, and at least a portion of the first active layer 101 is performed a conductor-conversion treatment to form the lower plate 302 of the storage capacitor 30. In other words, the lower plate of the storage capacitor 30 in the embodiment of the present disclosure is formed by performing a conductor-conversion treatment to a corresponding portion of the first active layer 101. Then a second gate insulation layer 150, the first gate electrode 104, and an interlayer dielectric layer 160 are deposited to be formed on the first active layer 101 in sequence. After that, referring to FIG. 6, the interlayer dielectric layer 160 is processed by a mask, and a metal layer is formed by physical vapor deposition, wherein the metal layer comprises the first connecting line 1802, the first through hole 1801, the second through hole 1803, and the third through hole 1804, the first connecting line 1802 is arranged on the interlayer dielectric layer 160, a first end of the first connecting line 1802 is electrically connected to the first drain electrode 103 via the first through hole 1801, the second through hole 1803 passes through the interlayer dielectric layer 160, and a second end of the first connecting line 1802 is electrically connected to the second gate electrode 114 via the second through hole 1803, completing a connection between the driving thin film transistor and the switching thin film transistor. At last, the passivation layer 170 is deposited to be formed on the interlayer dielectric layer 160 to form the thin film transistor array substrate 10. The driving thin film transistor comprises a low-temperature-polysilicon thin film transistor, and the switching thin film transistor comprises a metal oxide thin film transistor, for example, the metal oxide thin film transistor is an indium gallium zinc oxide thin film transistor.

Figure 7:
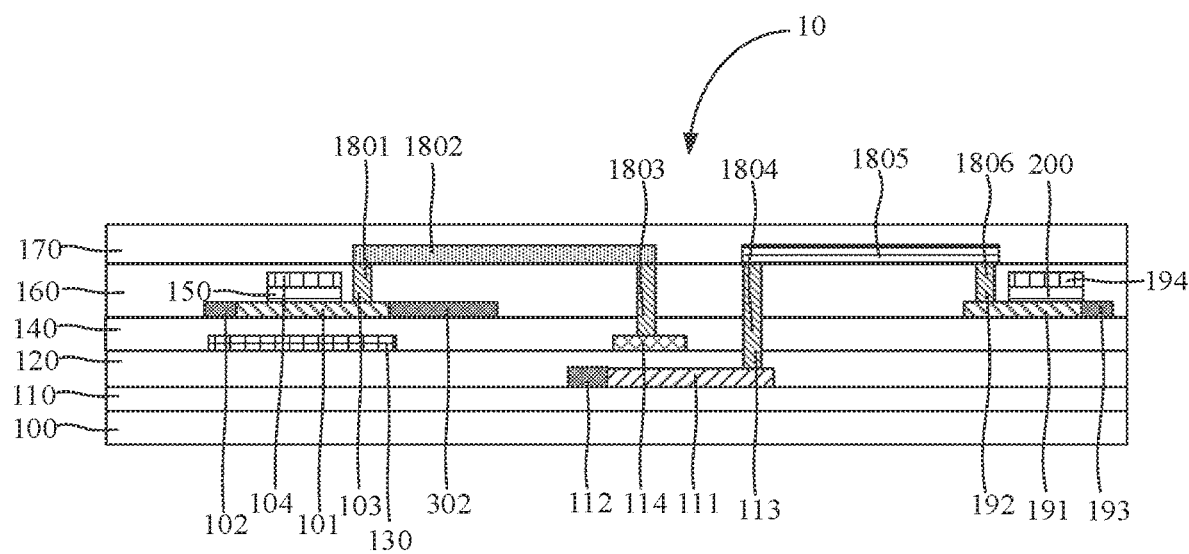

Optionally, referring to FIG. 7, in an embodiment of the present disclosure, the step S1 further comprises forming a compensation thin film transistor. The step of forming the compensation thin film transistor comprises forming a third active layer 191, a third gate electrode 194, a third source electrode 192, and a third drain electrode 193, wherein the third source electrode 192 and the third drain electrode 193 are electrically connected to the third active layer 191 respectively, and the third active layer 191 and the first active layer 101 are formed to be processed by a same mask. In another words, the third active layer 191 is formed in a process in which the first active layer 101 is formed.

Optionally, forming the thin film transistor array substrate 10 further comprises forming a third gate insulation layer 200, wherein the third gate insulation layer 200 is arranged on the third active layer 191, the third gate electrode 194 is arranged on the third gate insulation layer 200, and the third gate insulation layer 200 is formed when the second gate insulation layer 150 is formed. Furthermore, the metal layer further comprises a second connecting line 1805 and a fourth through hole 1806, wherein a first end of the second connecting line 1805 is electrically connected to the second drain electrode 113 via the third through hole 1804, and a second end of the second connecting line 1805 is electrically connected to the third source electrode 192 via the fourth through hole 1806, completing a connection between the driving thin film transistor, the switching thin film transistor, and the compensation thin film transistor.

In the step S3, referring to FIG. 1 or FIG. 2, in the step of forming the light-emitting element 20 on the thin film transistor array substrate 10, the light-emitting element 20 comprises the color filter layer 201, the anode 202, the light-emitting layer 203, the cathode 204, and the pixel definition layer 205, wherein a portion of the anode 202 corresponding to the lower plate 302 is used as an upper plate 301 of the storage capacitor 30. The lower plate 301 and the upper plate 302 are transparent, wherein a thickness of the lower plate 302 ranges from 10 nm to 100 nm, and a thickness of the upper plate 301 ranges from 40 nm to 180 nm.

Furthermore, the storage capacitor 30 comprises a dielectric layer 303, wherein the dielectric layer 303 comprises one or any combination of the interlayer dielectric layer 160, the passivation layer 170, a color filter layer 201 of the light-emitting element 20, and the pixel definition layer 205 of the light-emitting element 20, which are arranged between the lower plate 301 and the upper plate 302. The dielectric layer 303 comprises a material of high dielectric constant such as one or a combination of silicon nitride (SiNx) and aluminum oxide.

The beneficial effects are that in the display panel and the method for manufacturing the display panel provided in the embodiments of the present disclosure, the conductive portion of the first active layer of the switching thin film transistor is used as the lower plate of the storage capacitor, the portion of the anode of the light-emitting element corresponding to the lower plate is used as the upper plate, and the lower plate and the upper plate are designed to be transparent, to arrange the storage capacitor in a light-emitting area of the display panel through the arrangement, reducing an occupied area of the non-light-emitting area and improving an aperture ratio of the display panel when compared with an arrangement of a storage capacitor in a non-light-emitting area in the current technology.

Meanwhile, a dielectric material of high dielectric constant is used as the dielectric layer of the storage capacitor, further reducing an area of a capacitor area.

At last, in the display panel and the method for manufacturing the same provided in the embodiments of the present disclosure, the compensation thin film transistor is arranged on the thin film transistor array substrate, effectively compensating a threshold voltage of the driving thin film transistor in each pixel.

Although the present disclosure has been disclosed in the above preferred embodiments, the above preferred embodiments do not intend to limit the present disclosure. Various modifications and changes may be made by ordinary person skilled in the art without departing from the spirit and scope of this disclosure. Therefore, the scope of protection of this application is subject to the scope defined by the claims.

What is claimed is:

1. A display panel, comprising:
   a thin film transistor array substrate;
   a storage capacitor; and
   a light-emitting element;
   wherein the thin film transistor array substrate comprises a driving thin film transistor and a switching thin film transistor, and the driving thin film transistor and the switching thin film transistor are electrically connected;
   the driving thin film transistor and the light-emitting element are electrically connected; and
   the storage capacitor comprises a conductive portion of a first active layer of the switching thin film transistor as a lower plate and an anode of the light-emitting element as an upper plate opposite to the lower plate, wherein the lower plate and the upper plate are transparent.

2. The display panel as claimed in claim 1, wherein the switching thin film transistor comprises the first active layer, a first gate electrode, a first source electrode, and a first drain electrode, and the first source electrode and the first drain electrode are electrically connected to the first active layer, wherein the driving thin film transistor comprises a second active layer, a second gate electrode, a second source electrode, and a second drain electrode; the second source electrode and the second drain electrode are electrically connected to the second active layer respectively, and the second gate electrode is electrically connected to the first drain electrode.

3. The display panel as claimed in claim 2, wherein the thin film transistor array substrate further comprises:
   a substrate;
   a first buffer layer, wherein the second active layer covers a portion of the first buffer layer;
   a first gate insulation layer, wherein the first gate insulation layer covers the second active layer and the first buffer layer;
   a light-shielding layer, wherein the light-shielding layer and the second gate electrode are arranged on a same layer;
   a second buffer layer, wherein the second buffer layer covers the light-shielding layer, the second gate electrode, and the first gate insulation layer, and the first active layer is arranged on the second buffer layer;
   a second gate insulation layer, wherein the second gate insulation layer covers a portion of the first active layer, and the first gate electrode is arranged on the second gate insulation layer;
   an interlayer dielectric layer, wherein the interlayer dielectric layer covers the second buffer layer, the first active layer, and the first gate electrode;
   a metal layer, wherein the metal layer comprises a first connecting line, a first through hole, a second through hole, and a third through hole, the first connecting line is arranged on the interlayer dielectric layer, a first end of the first connecting line is electrically connected to the first drain electrode via the first through hole, the second through hole passes through the interlayer dielectric layer, a second end of the first connecting line is electrically connected to the second gate electrode via the second through hole, and the second drain electrode is electrically connected to the anode via the third through hole; and
   a passivation layer, wherein the passivation layer covers the interlayer dielectric layer.

4. The display panel as claimed in claim 3, wherein the metal layer further comprises a second connecting line and a fourth through hole, a first end of the second connecting line is electrically connected to the second drain electrode via the third through hole, and a second end of the second connecting line is electrically connected to the third source electrode via the fourth through hole.

5. The display panel as claimed in claim 1, wherein a thickness of the lower plate ranges from 10 nm to 100 nm, and a thickness of the upper plate ranges from 40 nm to 180 nm.

6. The display panel as claimed in claim 1, wherein the storage capacitor further comprises a dielectric layer, and the dielectric layer comprises one or any combination of the interlayer dielectric layer, the passivation layer, a color filter layer of the light-emitting element, and a pixel definition layer of the light-emitting element which are arranged between the lower plate and the upper plate.

7. The display panel as claimed in claim 6, wherein a material of the dielectric layer comprises one or a combination of silicon nitride and aluminum oxide.

8. The display panel as claimed in claim 1, further comprising a compensation thin film transistor, wherein the compensation thin film transistor comprises a third active layer, a third gate electrode, a third source electrode, and a third drain electrode, the third source electrode and the third drain electrode are electrically connected to the third active layer, and the third active layer and the first active layer are arranged on a same layer.

9. The display panel as claimed in claim 8, wherein the switching thin film transistor and the compensation thin film transistor comprise metal oxide thin film transistors, and the driving thin film transistor comprises a low-temperature polysilicon thin film transistor.

10. The display panel as claimed in claim 9, wherein the thin film transistor array substrate further comprises a third gate insulation layer, the third gate insulation layer is arranged on the third active layer, the third gate electrode is arranged on the third gate insulation layer, and the third gate insulation layer is formed when the second gate insulation layer is formed.

11. A method for manufacturing a display panel comprising following steps:
   forming a thin film transistor array substrate, wherein the thin film transistor array substrate comprises a driving thin film transistor and a switching thin film transistor, the switching thin film transistor comprises a first active layer, a first gate electrode, a first source electrode, and a first drain electrode, and the driving thin film transistor comprises a second active layer, a second gate electrode, a second source electrode, and a second drain electrode;

performing a conductor-conversion treatment to at least a portion of the first active layer to form a lower plate of a storage capacitor; and forming a light-emitting element on the thin film transistor array substrate, wherein the light-emitting element comprises a color filter layer, an anode, a light-emitting layer, a cathode, and a pixel definition layer, and a portion of the anode corresponding to the lower plate is used as an upper plate of the storage capacitor, wherein the lower plate and the upper plate are transparent.

12. The method for manufacturing the display panel as claimed in claim 11, wherein the step of forming the thin film transistor array substrate comprises:

forming a compensation thin film transistor, wherein the compensation thin film transistor comprises a third active layer, a third gate electrode, a third source electrode, and a third drain electrode, and the third source electrode and the third drain electrode are electrically connected to the third active layer.

13. The method for manufacturing the display panel as claimed in claim 12, wherein the third active layer is formed in a process in which the first active layer is formed.

14. The method for manufacturing the display panel as claimed in claim 12, wherein the switching thin film transistor comprises a metal oxide thin film transistor, and the driving thin film transistor comprises a low-temperature polysilicon thin film transistor.

15. The method for manufacturing the display panel as claimed in claim 11, wherein a thickness of the lower plate ranges from 10 nm to 100 nm, and a thickness of the upper plate ranges from 40 nm to 180 nm.

16. The method for manufacturing the display panel as claimed in claim 11, wherein the storage capacitor further comprises a dielectric layer, and the dielectric layer comprises one or any combination of the interlayer dielectric layer, the passivation layer, the color filter layer, and the pixel definition layer which are arranged between the lower plate and the upper plate.

17. The method for manufacturing the display panel as claimed in claim 16, wherein a material of the dielectric layer comprises one or a combination of silicon nitride and aluminum oxide.

* * * * *